United States Patent
Hoover et al.

(10) Patent No.: US 10,311,194 B2
(45) Date of Patent: Jun. 4, 2019

(54) METHOD OF RESOLVING MULTI-PATTERNED COLOR CONFLICTS FOR MULTI-ROW LOGIC CELLS

(71) Applicant: Samsung Electronics Co., Ltd., Suwon-si, Gyeonggi-do (KR)

(72) Inventors: Andrew P. Hoover, Austin, TX (US); Chandrakanth Ramesh, Austin, TX (US); David A. Petermann, Elgin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 653 days.

(21) Appl. No.: 14/828,496

(22) Filed: Aug. 17, 2015

(65) Prior Publication Data
US 2016/0147929 A1  May 26, 2016

Related U.S. Application Data

(60) Provisional application No. 62/082,609, filed on Nov. 20, 2014, provisional application No. 62/082,606, filed on Nov. 20, 2014.

(51) Int. Cl.
*G06F 17/50* (2006.01)
*G03F 1/70* (2012.01)

(52) U.S. Cl.
CPC ........... *G06F 17/5081* (2013.01); *G03F 1/70* (2013.01)

(58) Field of Classification Search
USPC ........................................................ 716/54
See application file for complete search history.

(56) References Cited

U.S. PATENT DOCUMENTS

| | | | |
|---|---|---|---|
| 8,434,033 B2 | 4/2013 | Abou Ghaida et al. | |
| 8,448,100 B1 | 5/2013 | Lin et al. | |
| 8,495,548 B2 | 7/2013 | Agarwal et al. | |
| 8,661,371 B1 | 2/2014 | Wang | |
| 8,719,765 B2 | 5/2014 | Cao et al. | |
| 8,726,215 B2 | 5/2014 | Lee et al. | |
| 8,732,628 B1 | 5/2014 | Wu et al. | |
| 8,739,095 B2* | 5/2014 | Cao .......................... | G06F 17/50 716/111 |
| 8,745,556 B2 | 6/2014 | Chen et al. | |
| 2012/0266110 A1* | 10/2012 | Cao .......................... | G03F 1/70 716/52 |
| 2013/0086543 A1* | 4/2013 | Agarwal ............. | G06F 17/5072 716/119 |

OTHER PUBLICATIONS

Final Office Action for U.S. Appl. No. 14/828,485, dated Jul. 24, 2018.
Office Action for U.S. Appl. No. 14/828,485, dated Jan. 2, 2018.
Notice of Allowance for U.S. Appl. No. 14/828,485, dated Jan. 4, 2019.

* cited by examiner

*Primary Examiner* — Eric D Lee
(74) *Attorney, Agent, or Firm* — Renaissance IP Law Group LLP

(57) ABSTRACT

According to one general aspect, a method may include dividing circuit cells into colorable sub-portions, wherein each circuit cell includes one or more colorable sub-portions. The method may include determining if a violating colorable sub-portion is to be re-colored. The method may include indicating that the violating colorable sub-portion is to be at least partially re-colored.

20 Claims, 7 Drawing Sheets

100

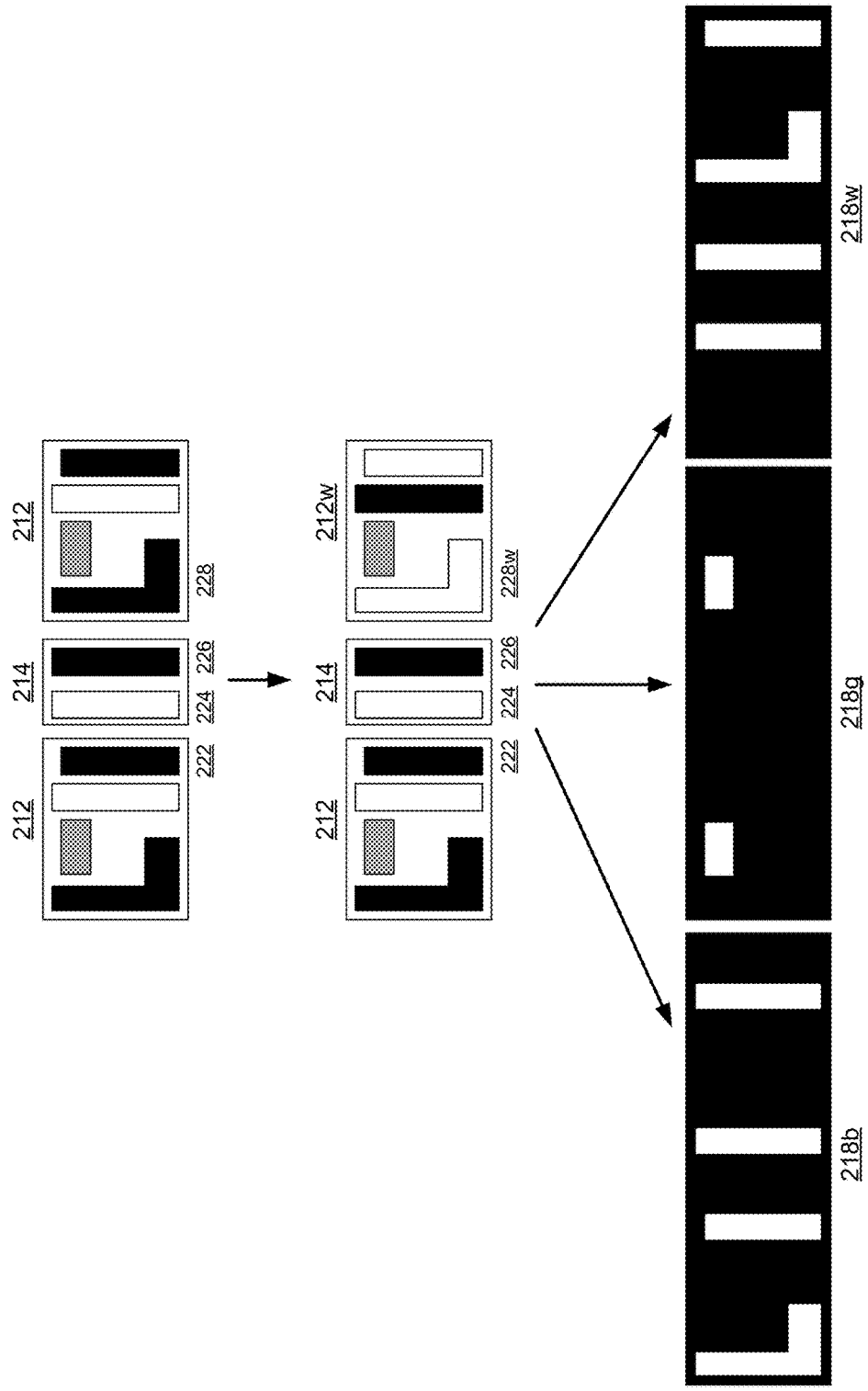

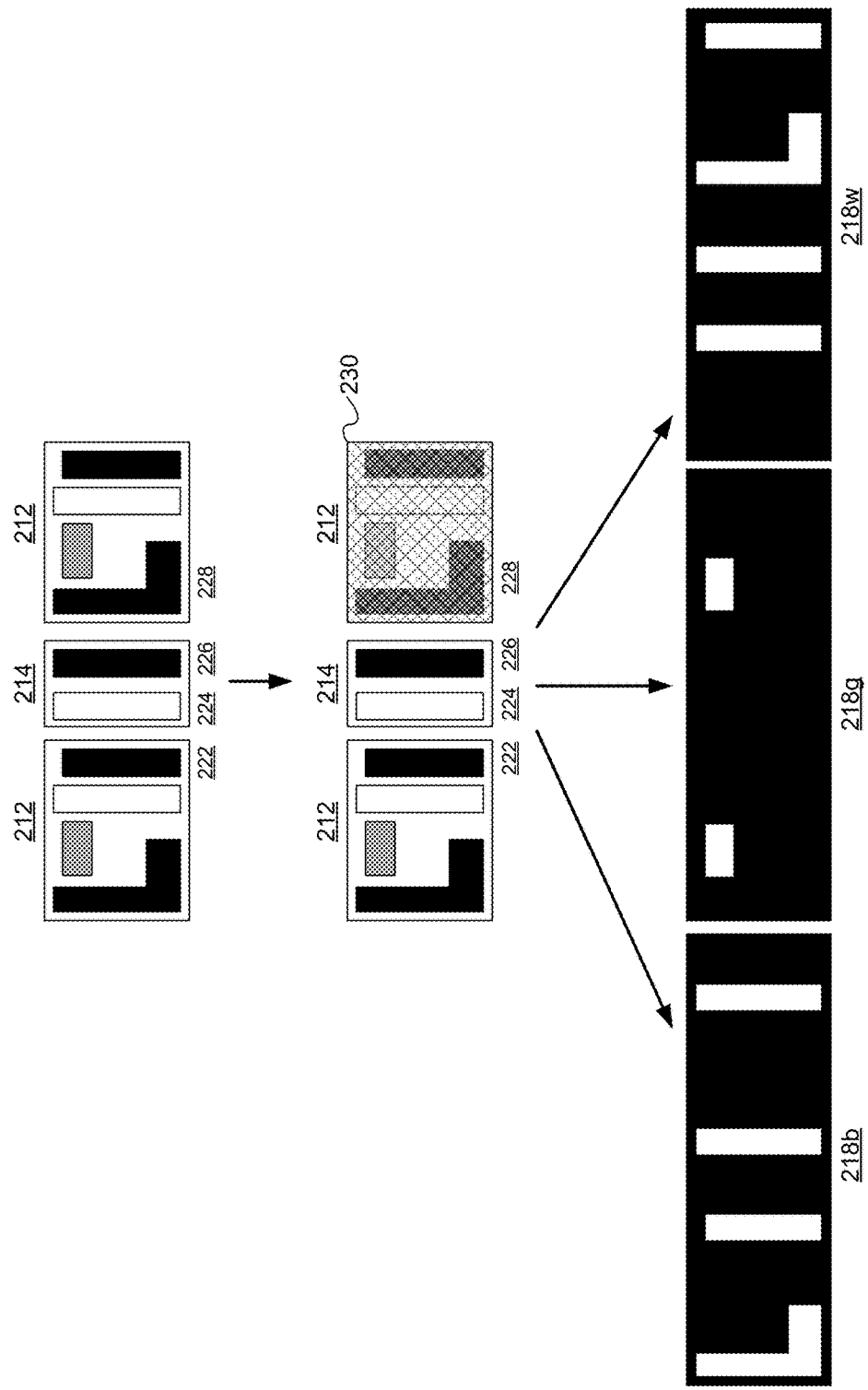

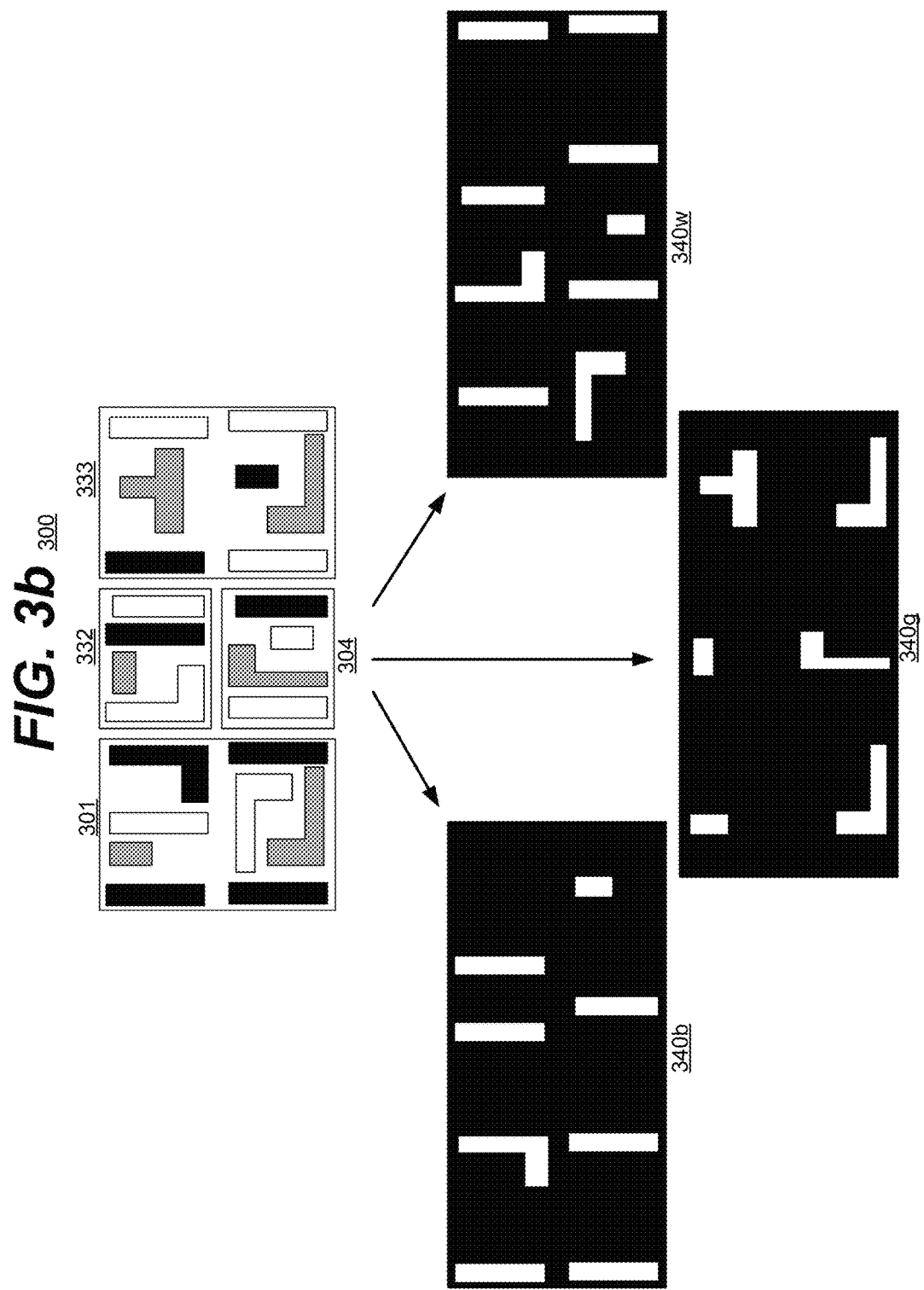

METHOD OF RESOLVING MULTI-PATTERNED COLOR CONFLICTS FOR MULTI-ROW LOGIC CELLS

CROSS-REFERENCE TO RELATED APPLICATION

This application claims priority under 35 U.S.C. § 119 to Provisional Patent Application Ser. No. 62/082,609, entitled "METHOD OF RESOLVING MULTI-PATTERNED COLOR CONFLICTS FOR MULTI-ROW LOGIC CELLS" filed on Nov. 20, 2014. The subject matter of this earlier filed application is hereby incorporated by reference.

This application claims priority under 35 U.S.C. § 119 to Provisional Patent Application Ser. No. 62/082,606, entitled "METHOD OF RESOLVING COLOR CONFLICTS FOR CELL-BASED DESIGNS WITH MULTI-PATTERN LITHOGRAPHY" filed on Nov. 20, 2014. The subject matter of this earlier filed application is hereby incorporated by reference.

TECHNICAL FIELD

This description relates to the manufacture of integrated circuits (ICs), and more specifically to the generation of lithographic masks.

BACKGROUND

Mask data preparation (MDP) is generally the procedure of translating a file containing the intended set of polygons from an integrated circuit layout into set of instructions that a photomask writer can use to generate a physical mask. MDP usually involves mask fracturing where complex polygons are translated into simple shapes (often rectangles and trapezoids) in a format that can be handled by the mask writing hardware.

Multiple patterning is a class of technologies for manufacturing integrated circuits (ICs), developed for photolithography to enhance the density at which components may be placed. An example of multiple patterning is double patterning, where a conventional lithography process is split into two masks or lithographic steps, such that components may be placed more closely together than would be possible if a single mask was used.

SUMMARY

According to one general aspect, a method may include dividing circuit cells into colorable sub-portions, wherein each circuit cell includes one or more colorable sub-portions. The method may include determining if a violating colorable sub-portion is to be re-colored. The method may include indicating that the violating colorable sub-portion is to be at least partially re-colored.

According to another general aspect, a method may include receiving a circuit layout database that includes instantiations of circuit cells, wherein each instantiation includes one or more layout portions, and wherein each layout portion is associated with a respective lithographic mask. The method may include organizing the instantiations of circuit cells into sub-portions of uniform height, wherein each instantiation includes one or more sub-portion. The method may include evaluating if a design rule violation occurs between a first sub-portion and a second sub-portion. The method may include determining if the design rule violation is to be corrected by re-associating one or more of the layout portions of the second sub-portion with a new lithographic mask. The method may include re-associating one or more of the layout portions of the second sub-portion with the new lithographic mask.

According to another general aspect, a system may include a place and route tool configured to place instantiations of template circuit cells in a ordered pattern in a database of circuit layout. The system may include color checker tool configured to: organize the instantiations into sub-portions, wherein each instantiation includes one or more sub-portion, determine if color conflicts occur between neighboring sub-portions, and indicate that a violating sub-portion is to be re-colored, in whole or part, to correct a detected color conflict. The system may include mask generator configured to generate at least two lithographic masks based upon a re-colored version of the circuit layout.

The details of one or more implementations are set forth in the accompanying drawings and the description below. Other features will be apparent from the description and drawings, and from the claims.

A system and/or method for the manufacture of integrated circuits (ICs), and more specifically for the generation of lithographic masks, substantially as shown in and/or described in connection with at least one of the figures, as set forth more completely in the claims.

BRIEF DESCRIPTION OF THE DRAWINGS

FIG. 2a is a block diagram of an example embodiment of a series of components processed in accordance with the disclosed subject matter.

FIG. 2b is a block diagram of an example embodiment of a series of components processed in accordance with the disclosed subject matter.

FIG. 3b is a block diagram of an example embodiment of a series of components processed in accordance with the disclosed subject matter.

Like reference symbols in the various drawings indicate like elements.

DETAILED DESCRIPTION

Figure 1:
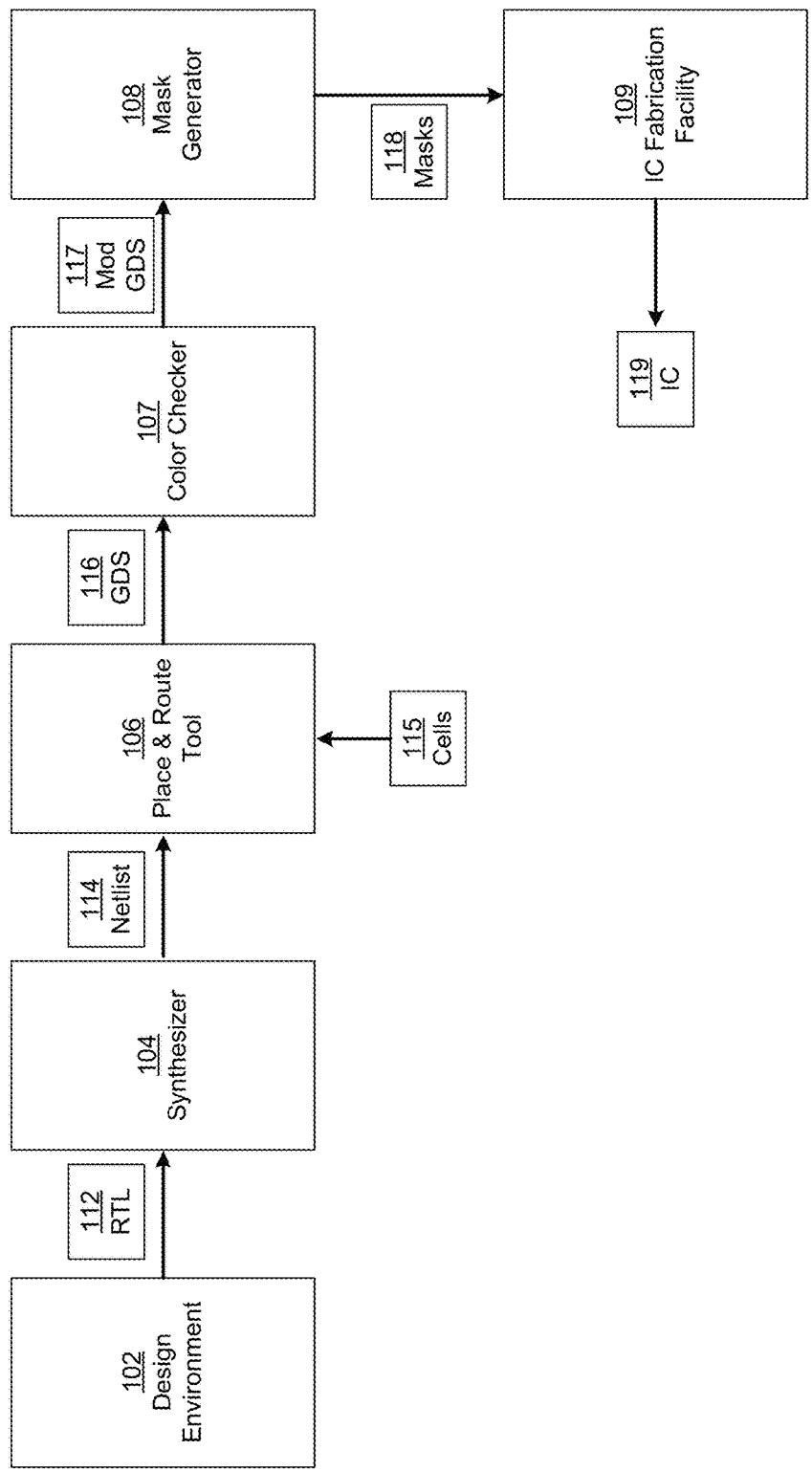
FIG. 1 is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of shapes and regions may be exaggerated for clarity.

It will be understood that when an element, component, or shape is referred to as being "on," "connected to" or "coupled to" another element, component, or shape, it can be directly on, connected or coupled to the other element, component, or shape or intervening elements, components, or shapes may be present. In contrast, when an element, component, or shape is referred to as being "directly on", "directly connected to" or "directly coupled to" another element, component, or shape, there are no intervening elements, components, or shapes present. Like numerals refer to like elements throughout. As used herein, the term "and/or" includes any and all combinations of one or more of the associated listed items.

It will be understood that, although the terms first, second, third, etc. may be used herein to describe various elements, components, regions, shapes, layers and/or sections, these elements, components, regions, shapes, layers and/or sections should not be limited by these terms. These terms are only used to distinguish one element, component, region, shape, layer, or section from another element, component, region, shape, layer, or section. Thus, a first element, component, region, shape, layer, or section discussed below could be termed a second element, component, region, shape, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. In various embodiments, the system 100 may be used for electronic design automation and may represent a few illustrative stages of the design process for creating integrated circuits. In such an embodiment, the system 100 may include a number of design tools.

In various embodiments, the system 100 may include a design environment 102 in which a user (not shown) may define (e.g., via a hardware description language, etc.) the features and functionality of an IC. The output of the design environment 102 may include one or more files 112 that logically define the IC (e.g., register transfer level (RTL) files, etc.).

In some embodiments, these RTL files 112, may be passed through a synthesizer 104 or synthesis tool. In such an embodiment, the synthesizer 104 may convert an abstract form of desired circuit behavior (e.g., the RTL files 112) into a design implementation represented in terms of logic gates or a netlist 114. In some embodiments, this process may be done by hand or manually. In another embodiment, the process may occur via a combination of manual and automated steps.

In the illustrated embodiment, the system 100 may include a place and route tool 106. In such an embodiment, the place and route tool 106 may be configured to take the netlist 114 and produce an IC layout that may be automatically converted to a mask set. As the name suggests a place and route tool 106 may be configured to place the various circuits described in the netlist 114 in an order or arrangement suitable for manufacture (or the next stage in the design process), and then route interconnecting wires between the various circuits.

In such an embodiment, the place and route tool 106 may make use of a library of standardized circuit cells 115. For example, the library of circuit cells 115 may include a cell for a NAND gate. In such an embodiment, the place and route tool 106 may instantiate that template of the NAND gate wherever in the design such a NAND gate is needed or used, likewise for NOR gates, flip-flops, etc. As such, all instances of that NAND cell will have the same metal shapes on the same layers, etc. Generally, a place and route tool 106 may layout, or "place", the cells 115 in a grid pattern of rows and/or columns.

In various embodiments, the place and route tool 106 may output a file 116 presenting planar geometric shapes, text labels, and other information about the layout in hierarchical form. In the illustrated embodiment, this file may be substantially compliant with the Graphics Data System (GDS) file format, or file formats derived from that standard (e.g., GDSII, etc.). In another embodiment, the Open Artwork System Interchange Standard (OASIS) may be employed. In yet another embodiment, some other standard may be employed. It is understood that the above are merely a few illustrative examples to which the disclosed subject matter is not limited.

In the illustrated embodiment, the system 100 may include a design rule or color checker 107. In various embodiments, the color checker 107 may check for and/or correct design rule violations created by the place and route tool 106. In some embodiments, the color checker 107 may be integrated with the place and route tool 106, but is shown separately here for illustrative purposes.

In general, design rules are a series of parameters provided by semiconductor manufacturers that enable the designer to verify the correctness of a mask set. Design rules are often specific to a particular semiconductor manufacturing process. A design rule set specifies certain geometric and connectivity restrictions to ensure sufficient margins to account for variability in semiconductor manufacturing processes, so as to ensure that most of the parts work correctly.

For example, design rules may specify a minimum width that a certain object or component of a circuit cell may be, a minimum distance between two components of a circuit cell, etc. For example, if two objects are too close together the lithographic manufacture process may not have sufficient resolution to make the objects properly. Thus, a design rule may specify the minimum distance between objects. It is understood that the above is merely one illustrative example to which the disclosed subject matter is not limited.

As described above, one way to enable denser components is to use a multi-patterning lithographic process. In such an embodiment, multiple masks are used to generate components that would have only required a single mask in traditional single-pattern lithography. While each mask may obey minimum distance design rules applicable to a single mask, when put together the multiple masks result in objects in the manufactured IC 119 that may be closer together than any objects of any single mask.

In this context, the term of art "color" is used to refer to each mask of mask set 118. While a lithographic process may use the same wavelength of light for each mask, for ease of reference each mask is referred to as having a particular color (e.g., red, blue, etc.). Therefore, when cell components are too close together on the same mask, a "color violation" or "color conflict" is said to have occurred. Generally, a solution to such a color violation is to "re-color" a component or instance of a cell from cell library 115. In this context, re-coloring means re-associating the violating components or cell instantiation with different lithographic masks. This is shown more explicitly in reference to FIG. 2a.

In the illustrated embodiment, the color checker 107 may be configured to check for such color violations and correct such color violations by re-coloring the cells, as needed. In such an embodiment, the color checker 107 may produce a modified GDS 117.

In various embodiments, the system 100 may include a mask generator 108 that is configured to generate one or more masks 118 from the modified GDS 117. The mask generator 108 may include the function of mask data preparation. These masks 118 may then be used to manufacture the IC 119, via an IC fabrication facility 109.

FIG. 2a is a block diagram of an example embodiment of components 201 processed in accordance with the disclosed subject matter. In the illustrated embodiment, a more simplified form of color correction or re-coloring is shown. This is a form of re-coloring that may be employed in a less preferred embodiment of the disclosed subject matter, but also shows conceptually the effects desired by a more preferred embodiment of the disclosed subject matter. A more detailed description of a preferred embodiment is illustrated in FIG. 2b.

In the illustrated embodiment, two template circuit cells may be employed (only a small section of an IC design is shown). The illustrated portion may include two instantiations of the cell 212 sandwiching an instantiation of a cell 214, for a total of three instantiated circuit cells.

As described above, components within a circuit cell are generally associated with respective lithographic masks or (colloquially) colors. In the illustrated embodiment, a three color process is shown, but it is understood that the above is merely one illustrative example to which the disclosed subject matter is not limited. Generally, the first two colors are referred to as blue and red, with no general agreement on the term used for subsequent (e.g., the third. etc.) colors (e.g., green, yellow, etc.). In the illustrated embodiment, to conform to the Patent Office's drawing requirements, the three colors or lithographic masks will be referred to as black, grey, and white.

In the illustrated embodiment, the cells (e.g., cells 212 and 214, etc.) may be designed to not cause any design rule (DR) violations within the cell. However, when placed together (e.g., by a place and route tool, etc.) the combination of cells may cause DR violations, specifically color conflicts. This may generally occur at the edges of the cell, where they meet. In general, as cells are typically laid out in rows, often with power rails (not shown) on the upper and lower row boundaries, color conflicts between rows are rare, but are within the scope of the disclosed subject matter.

In one embodiment, the color checker may be configured to examine the edges of the cells for DR violations or color conflicts. For example, the edge where the first (left) instance of cell 212 and cell 214 meet may be examined. In this case the component 222 (of the first cell 212) may be colored black, and the component 224 (of the cell 214) may be colored white. As the colors (or lithographic mask associations) of the two components 222 and 224 are different, proper spacing is assured and no color conflict exists.

Conversely, when the color checker examines the edge between the cell 214 and the second (right) instance of the cell 212 a color conflict may be found. In the illustrated embodiment, the right edge of cell 214 may include the black component 226 and the left edge of cell 212 may also include a black component 228. When placed together the two components 226 and 228 may cause a design rule violation or color conflict. In various embodiments, the solution to this color conflict may be to recolor the second instantiation of the cell 212, such that all originally black components are turned to white and vice versa.

In one such embodiment, the second instantiation of the cell 212 may be replaced by a similar but different template of the cell 212 (e.g., cell 212w). This similar but different template of the cell 212 may be functionally identical (e.g., perform a NAND function, etc.) but may be colored differently (e.g., component 228 is white, etc.). In some embodiments, this similar but different template of the cell 212 may be included in the cell library (thereby increasing the size of the library). It is understood that the above is merely one illustrative example to which the disclosed subject matter is not limited.

In another embodiment, shown in more detail in FIG. 2b, the same template of cell 212 may be used, but an indication may be included in the GDS file (or whatever file standard is used by the embodiment) that indicates that a color swap or re-coloring should occur. In the illustrated embodiment of FIG. 2a, a re-colorized version of cell 212 is shown for illustrative purposes as cell 212w.

In the illustrated embodiment, the re-colored cell 212w may replace the originally colored second instance of cell 212. In such an embodiment, the black component 228 may be replaced by a white version, component 228w. Likewise, other (unnumbered) black and white components within the cell 212w may also be swapped between black and white. As no two components of the same color (e.g., black, etc.) are too closely spaced, the prior design rule violation may be avoided or corrected.

Finally, three different lithographic masks 218b, 218g, and 218w are shown. Lithographic mask 218b may be employed to form the pattern of the black components of the cells 212, 214, and 212w during the fabrication process. Lithographic mask 218g may be employed to form the pattern of the grey components of the cells 212, 214, and 212w during the fabrication process. Lithographic mask 218w may be employed to form the pattern of the white components of the cells 212, 214, and 212w during the fabrication process. In the illustrated embodiment, the white features of 218b, 218g, and 218w represent the desired features on the manufactured IC, while the space between these features is represented by black. The actual appearance of the shapes on the mask will depend on aspects such as photoresist polarity, process details, etc., and it is understood that the colors and shapes drawn in 218b, 218g, and 218w are merely one illustrative example to which the disclosed subject matter is not limited.

FIG. 2b is a block diagram of an example embodiment of a series 202 of components processed in accordance with the disclosed subject matter. In the illustrated embodiment, the same color conflict as FIG. 2a related to components 226 and 228 is shown, but more detail is provided as to a preferred embodiment of correcting that color conflict.

In the illustrated embodiment, instead of replacing the second (right) instance of the circuit cell 212 with a re-colored version (e.g., cell 212w, etc.), the color checker may simply indicate that the cell instance needs to be recolored and the mask generator may be configured to perform the color correction. In the illustrated embodiment, the second instance of the cell 212 may not be replaced (as was done in a less preferred embodiment). Instead the GDS may be created or altered to indicate that a re-colorization is desired.

In the illustrated embodiment, a shape 230 may be added or altered within the GDS file. This shape 230 may be on a 'color swap' layer, which instructs the mask generator to swap colors. In various embodiments, the color swap layer shape 230 may be so called because it indicates that one or more shapes of a cell (e.g., cell 212, etc.) are to be re-colored. The shapes may designate a metal layer (e.g. M1, etc.). In various embodiments, each metal layer (e.g., M1, M2, etc.) may be associated with a respective color swap layer. It is understood that a color swap layer may apply to layers other than metal layers (e.g. implant layers, contact layers, conductors other than metal, etc.). It is further understood that the above is merely one illustrative example to which the disclosed subject matter is not limited.

In the illustrated embodiment, the color swap layer shape 230 may include a bounding box, rectangle, or polygon that overlays the portion of the cell (e.g., the second instance of cell 212, etc.) in which re-coloring is desired. Further, in the illustrated embodiment, the color swap layer shape 230 may indicate that two colors are to be swapped (e.g., black to white, and white to black, etc.). In such an embodiment, when the mask is being generated the metal component 228 (black in the template of cell 212) may be re-colored to white, and likewise for the other black metal components within the second instance of cell 212. And, the white metal components within the second instance of cell 212 may be re-colored to black.

Other embodiments may include operations involving more than two colors. For example, in another embodiment, the color swap layer shape 230 may indicate that the various colors (or lithographic mask associations) are to be cycled or rotated (e.g., black become grey, grey becomes white, white becomes black, etc.). It is understood that the above are merely a few illustrative examples to which the disclosed subject matter is not limited.

In some embodiments, the color swap layer shape 230 may be a shape or data structure within the GDS file. In another embodiment, the color swap layer shape 230 may be drawn on one of a plurality of color swap layers or possible layers. For example, in one embodiment, in a two color system there may be a single layer (swapping the first and second colors). In a three color scheme there may be three layers (e.g., a first swapping black and white, a second swapping black and grey, and a third swapping grey and white, etc.). In general, schemes with a plurality of colors may have sufficient layers, such that all possible color swap permutations are permissible. In another embodiment, only a sub-set of permutations may be included. In some embodiments, shapes on all possible layers may not exist within the GDS and may only be created as needed once a desired re-colorization is determined. It is understood that the above are merely a few illustrative examples to which the disclosed subject matter is not limited.

In various embodiments, the color checker may output a modified GDS (or other standard) file that includes one or more color swap layer shapes indicating that the components of various cell instantiations are to be re-associated with different lithographic masks. In such an embodiment, the re-colored cell (e.g., the second instantiation of cell 212) may not be replaced with an instantiation of an alternate version of the cell (e.g., the white colored version cell 212w of FIG. 2a), but instead the same template cell (e.g., cell 212, etc.) may be used for all color variations. In such an embodiment, the size of the cell library may be reduced (as only one template for cell 212 need exist). Further this may reduce the risk of error and potential product failure caused by the incorrect duplication and re-colorization of cell templates (e.g., to produce a cell template like cell 212w of FIG. 2a).

Finally, given the modified GDS file, with the color swap layer shape 230, the mask generator may create the masks 218b, 218g, and 218w. In the illustrated embodiment, these masks 218b, 218g, and 218w may be identical to the masks generated in FIG. 2a, as the actual re-colorization is performed by the mask generator and not the color checker or the place and route tool.

Figure 3A:
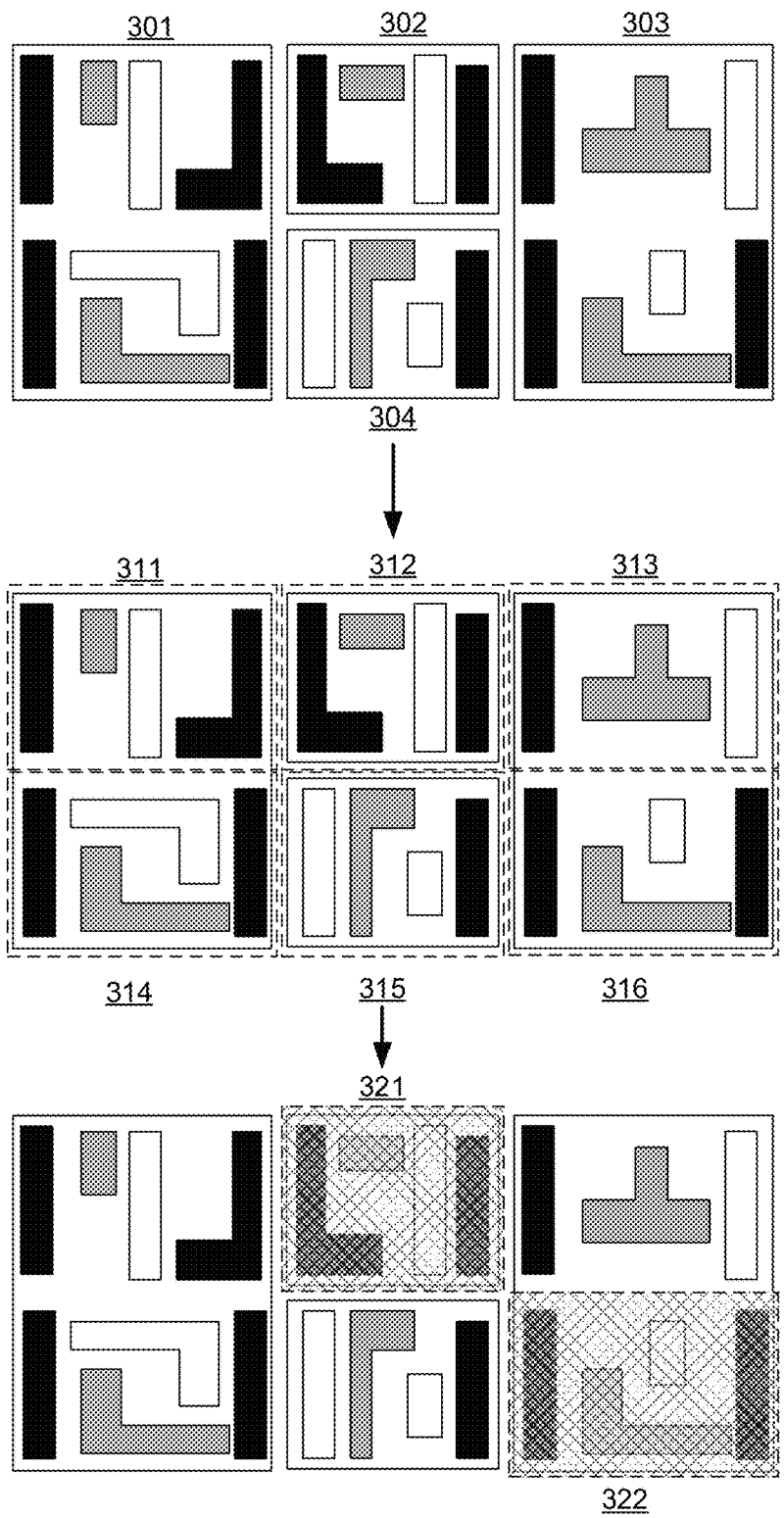
FIG. 3a is a block diagram of an example embodiment of a series of components processed in accordance with the disclosed subject matter.

FIG. 3a is a block diagram of an example embodiment of a series 300 of components processed in accordance with the disclosed subject matter. The illustrated embodiment shows an example of processing color conflicts by subdividing cells (or instances of circuit cells) into colorable sub-portions. In the illustrated embodiment, two rows of a cell layout are shown but it is understood that this is merely an illustrative example and a full design may include any number of rows or columns.

In the illustrated embodiment, there are four cells 301, 302, 303 and 304. Cells 302 and 304 may include single row cells that each occupy part of only one row. For example, cell 302 occupies part of only the top row; whereas cell 304 occupies part of only the bottom row. Conversely, cells 301 and 303 are multi-row cells in that they each are so large that they each occupy two rows of a cell layout. In various embodiments, these multi-row cells may include things like multi-bit flip-flops, level-shifters, etc. It is understood that the above are merely a few illustrative examples to which the disclosed subject matter is not limited. Further, while two-rowed multi-height cells are illustrated, it is understood that the disclosed subject matter is not limited to a maximum number of rows and that other multi-height cells (e.g., three-rows, four-rows, etc.) are contemplated.

Traditionally, a cell may be re-colored as a whole. Therefore, if cell 303 was to be re-colored both the top row and bottom row portion of the cell 303 would be re-colored. In various embodiments, this all-or-nothing approach may limit the flexibility a place and route tool, or color checker may have in solving color conflict issues.

In the illustrated embodiment, instead of treating cells in an all-or-nothing manner, the cells may be divided into one or more colorable sub-portions. In one embodiment, a colorable sub-portion may be defined as one cell width wide (e.g., this may vary with the respective width of cells), but may have a constant height (e.g., one row tall, etc.). In such an embodiment, if a multi-height or multi-rowed cell is encountered, it may be divided into multiple colorable sub-portions of one row-height tall. Conversely, single-height cells may remain as a single colorable portion.

For example, the two-row cell 301 may be divided into two colorable portions 311 and 314. The single-row cell 302 may only include the colorable portion 312. Likewise, the single-row cell 304 may only include the colorable portion 315. And, the two-row cell 303 may be divided into two colorable portions 313 and 316.

In such an embodiment, the color checker may then process the layout based upon colorable portions instead of cells. In such an embodiment, the color checker may check for color conflicts between the portions 311 and 312, as opposed to between cells 301 and 302. In the illustrated embodiment, a black-to-black color conflict may exist between the portions 311 and 312. In such an embodiment, the color checker may be configured to re-color the portion 312 or indicate that portion 312 should be re-colored by a mask generator. In the illustrated embodiment, color swap layer shape 321 may be added to the GDS file to indicate that the portion 312 should be re-colored.

In the illustrated embodiment, the color checker may then check for conflicts between the re-colored portion 312 and portion 313 (not cell 303 but the portion 313). In the illustrated embodiment, no color conflict exists between the re-colored portion 312 and portion 313. As the color checker re-colored the portion 312 from black-to-white, the right-most black component of the original or default portion 312 has been re-colored to white. Therefore, there is no color conflict between the right-most and re-colored now-white component of portion 312 and the left-most black component of portion 313.

Checking may then progress to the next row (or bottom row, in the example). The color checker may then check for a color conflict between portions 314 and 315. No color conflict exists in this example between those two portions.

The color checker may then check for a color conflict between portions 315 and 316. In the illustrated embodiment, a color conflict may exist between the portions 315 and 316 (specifically a black-to-black conflict along the abutting edges).

In a traditional system, in which cells were re-colored in whole, swapping the black components to white within the cell 303 would cause a new color conflict between portions 312 and 313. Changing the left-most black component in the upper row of cell 303 to white (as part of a whole-cell re-coloring) would cause a conflict with the right-most component of portion 312 or cell 302 (which had been previously re-colored to white). Therefore, the problem of solving the color conflict between portions 315 and 316 becomes complex as a whole-cell color swap would ripple through the layout and across rows.

In the illustrated embodiment, each colorable sub-portion may be color swapped separately, even if a cell includes multiple colorable sub-portions (like cell 303 does). In such an embodiment, it may be possible to only color swap portion 316. Color swap layer shape 322 may be added to indicate that colorable sub-portion 316 is to be color swapped. This may allow a cell (e.g., cell 303) to be re-colored in part, in whole, or not at all and generally reduces the level of granularity applied to the color conflict resolution process.

FIG. 3*b* is a block diagram of an example embodiment of a series 300 of components processed in accordance with the disclosed subject matter. FIG. 3*b* continues the process started in FIG. 3*a*.

FIG. 3*b* shows what the four cells 301, 302, 303, and 304 would look like if they were re-colored. The new, re-colored versions of cells 302 and 303 are shown as cells 332 and 333, respectively. In various embodiments, such a physical layout may never actually exist either as an output from the color checker (or integrated place and route tool) or as an input to the mask generator. Instead this is shown mostly to help the reader understand the desired coloring indicated by the color swap layer shapes 321 and 322 of FIG. 3*a*.

However, in some embodiments, the default cells 302 and 303 may be physically replaced with color-alternate cells 332 and 333. As described above, traditionally re-colored instantiations of cells may be replaced with alternate versions of the cell templates. In such an embodiment, cell templates of both cells 302 and 332 may exist within a cell library. Likewise, cell templates of both cells 303 and 333 may exist within a cell library. It is understood that the disclosed subject matter is not limited to the use of a color swap layer.

In various embodiments, the mask generator may create the three colored lithographic masks 340*b*, 340*g*, and 340*w*. In such an embodiment, the lithographic mask 340*b* may be used to create the black components. The lithographic mask 340*g* may be used to create the grey components. And, the lithographic mask 340*w* may be used to create the white components.

Figure 4:
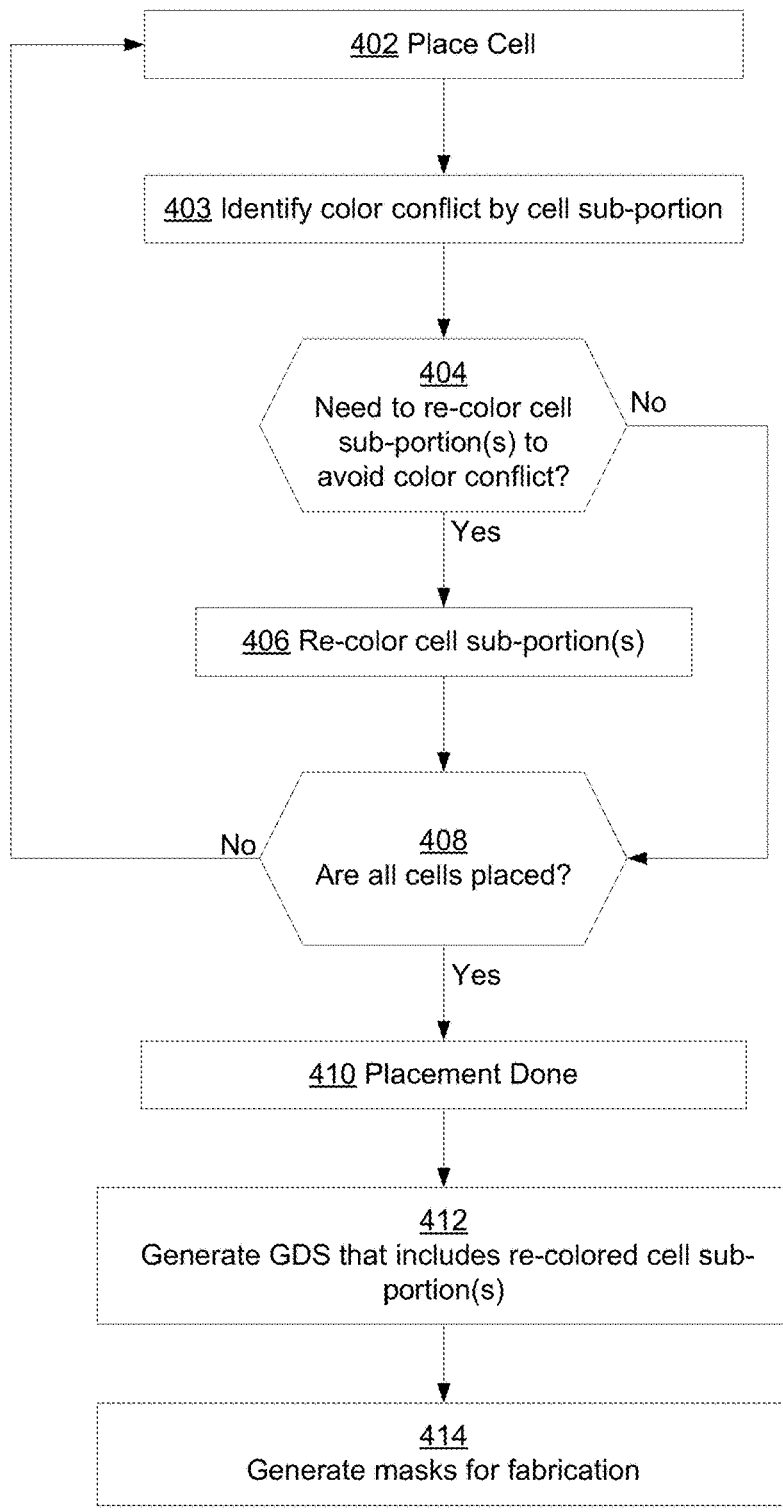
FIG. 4 is a flowchart of an example embodiment of a technique in accordance with the disclosed subject matter.

FIG. 4 is a flowchart of an example embodiment of a technique 400 in accordance with the disclosed subject matter. In various embodiments, the technique 400 may be used or produced by the systems such as those of FIG. 1 or 5. Furthermore, portions of technique 400 may be used to produce or alter components such as those of FIGS. 2*a*, 2*b*, 3*a*, and/or 3*b*. Although, it is understood that the above are merely a few illustrative examples to which the disclosed subject matter is not limited. It is understood that the disclosed subject matter is not limited to the ordering of or number of actions illustrated by technique 400.

Technique 400 illustrates an embodiment in which an integrated place and route tool, and color checker are employed. In the illustrated embodiment, color conflicts are checked as each cell (or instantiation of a cell template) is placed. In another embodiment (not shown in detail), all of the cells may be placed prior to evaluation by the color checker, and the color checker may subsequently check for color conflicts. In various embodiments, this may be done in two phases by an integrated place and route tool, or as two separate processes by separated place and route, and color checker tools. Further, in various embodiments, the place and route tool may perform its own version of color checking and then a dedicated color checker tool may perform a version of color checking analogous to that described herein. In another embodiment, the place and route tool may be configured to provide no, minimal, or reduced color checking and instead let a separate color checking tool perform the color checking. It is understood that one skilled in the art will be able to understand the differences between the illustrated technique 400 and the above mentioned variation in which all or most cell placement has occurred prior to color checking.

Block 402 illustrates that, in one embodiment, a cell or more specifically an instantiation of a circuit cell template, may be placed within a design by a place and route tool, as described above. In various embodiments, placing the cell may include dividing the cell into colorable sub-portions, as described above.

Block 403 illustrates that, in one embodiment, the color checker may evaluate each cell not as a whole, but by colorable sub-portion. As described above, if a cell is a multi-row cell, the color checker may evaluate only one colorable sub-portion at a time. Further, in some embodiments, if a cell is a multi-row cell, the color checker may evaluate only colorable sub-portions that are included on a current row, and wait to evaluate additional sub-portions until the next rows are evaluated. It is understood that the above are merely a few illustrative examples to which the disclosed subject matter is not limited. In some embodiments, if the placed cell was not previously divide into colorable sub-portion (e.g., as part of Block 402), this division may occur in Block 403.

Block 404 illustrates that, in one embodiment, the color checker may determine if a colorable sub-portion needs to be re-colored to avoid a color conflict.

Block 406 illustrates that, in one embodiment, if sub-portion re-colorization is desirable, one or more sub-portions may be re-colored or marked for re-colorization. In one embodiment, a sub-portion may be re-colored by replacing the entire cell (or instantiation thereof) with an alternate version of the cell that has been colored differently. It is understood that a color conflict caused by placing a cell may require re-coloring multiple cell sub-portions from different cells. For example, if a cell instance is placed between two cells, a color conflict may be created with the cell on the left of the most recently placed cell instance. This conflict may be resolved by re-coloring a sub-portion of the most recently placed cell instance. However, this may cause a new color conflict with the cell instance on the right of the most recently placed cell instance. This new conflict may be resolved by re-coloring a sub-portion of the cell on the right. Resolving a color conflict caused by placing a cell may also require re-coloring portions of cells that are not adjacent to the most recently placed cell instance. It is understood that the above are merely illustrative examples to which the disclosed subject matter is not limited.

In another embodiment, a color swap layer shape may be created or altered. As described above, in some embodiments, this may entail creating or defining a shape in a color swap layer. In various embodiments, the shape may cover the entire instantiation of the re-colored cell, but in the case of multi-rowed cells may only cover the violating sub-portion. In another embodiment, the color swap layer shape(s) may be selectively drawn around one or more components within the re-colored sub-portion.

Block 408 illustrates that, in one embodiment, a check may be made to determine if all the desired cells have been placed. If not, Block 402 illustrates that another cell may be placed, and the process may continue until all cells are placed. If all cells or cell instantiations have been placed, as illustrated by Block 410, the cell instantiation placement may be considered done.

Block 412 illustrates that, in one embodiment, a GDS file may be generated. This GDS file will contain re-colored cell portions to resolve color conflicts. In various embodiments, the GDS file may include one or more color swap layers that indicate that one or more components of circuit cells are to be re-colored or re-associated with different lithographic masks, as described above. The GDS file may also include the swap or re-colorization shapes or geometries on the color swap layers. In some embodiments, the GDS file may contain multiple alternate versions, or color variants, of a master template cell that have been re-colored by cell sub-portion. In some embodiments, this GDS file may include or be incorporated into a database file.

Block 414 illustrates that, in one embodiment, a mask generation tool may generate the masks used for IC fabrication. As described above, the mask generation tool may use the geometries described in the GDS file (output from Block 412) to generate the masks. Further, as described above, in an embodiment in which a color swap layer is employed, when a color swap layer or shape within a color swap layer is encountered, the mask generator may be configured to re-color the indicated components of the respective instantiated cell. In such an embodiment, despite a cell template or definition indicating that a certain component is to be associated with a first lithographic mask, the color swap layer shape may indicate that the component is to be associated, instead, with a second lithographic mask.

Figure 5:
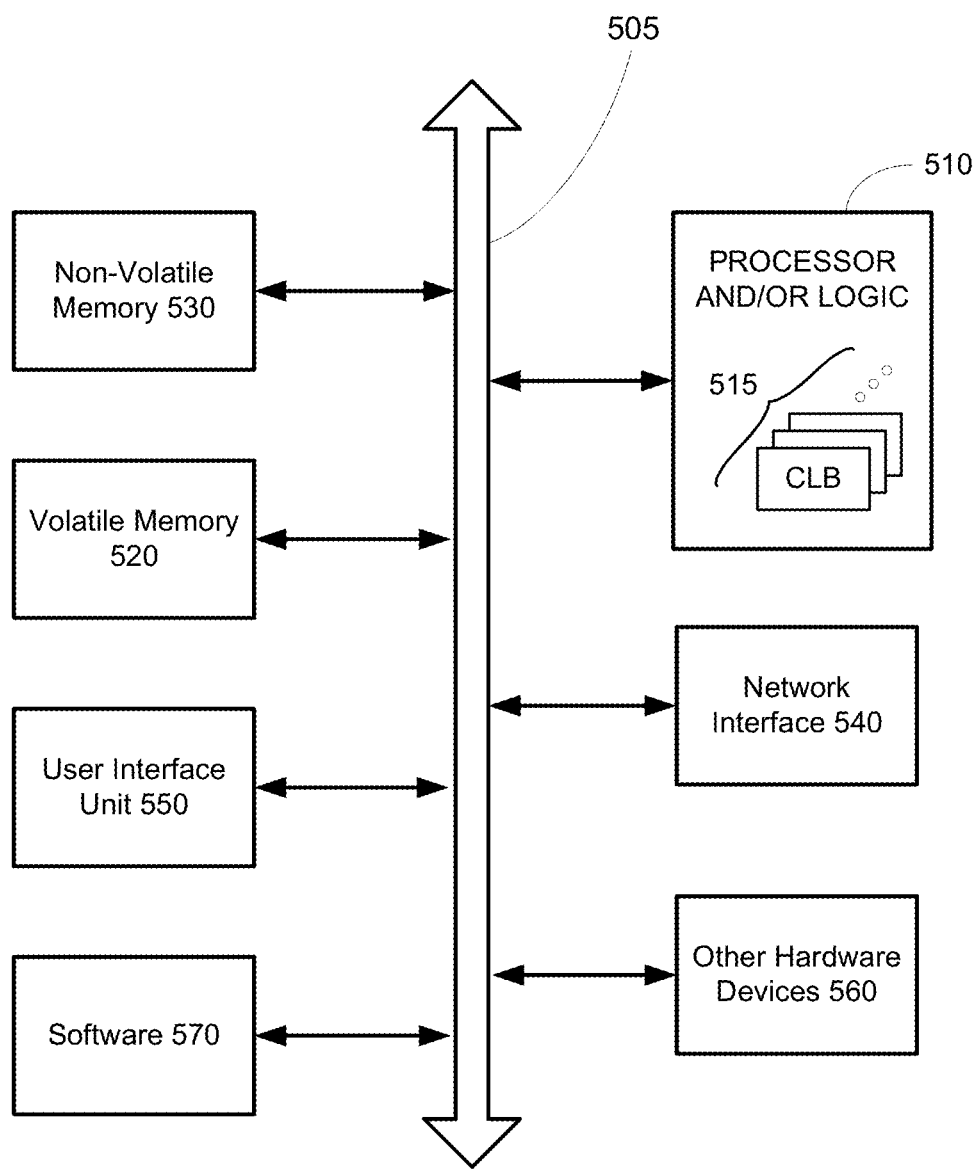
FIG. 5 is a schematic block diagram of an information processing system that may include devices formed according to principles of the disclosed subject matter.

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers, etc. or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR, etc.), stabilizing logic devices (e.g., flip-flops, latches, etc.), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM), etc.). The information processing system 500 according to the disclosed subject matter may further include a non-volatile memory 530 (e.g., a hard drive, an optical memory, a NAND or Flash memory, etc.). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network using a protocol. Examples of a Wi-Fi protocol may include, but are not limited to, Institute of Electrical and Electronics Engineers (IEEE) 802.11g, IEEE 802.11n, etc. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), etc. Examples of a wired protocol may include, but are not limited to, IEEE 802.3 (a.k.a. Ethernet), Fibre Channel, Power Line communication (e.g., HomePlug, IEEE 1901, etc.), etc. It is understood that the above are merely a few illustrative examples to which the disclosed subject matter is not limited.

The information processing system 500 according to the disclosed subject matter may further include a user interface unit 550 (e.g., a display adapter, a haptic interface, a human interface device, etc.). In various embodiments, this user interface unit 550 may be configured to either receive input from a user and/or provide output to a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor, etc.). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540, etc.) of the information processing system 500. In such an embodiment, the information processing system 500 may include one or more native applications, which may be installed locally (e.g., within the non-volatile memory 530, etc.) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey, etc.) or a virtual execution machine (VM) (e.g., the Java Virtual Machine, the Microsoft Common Language Runtime, etc.) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, etc.). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. A method of resolving circuit design rules, the method comprising:
   accessing circuit cells from a cell library stored on a computer-readable medium;
   creating new colorable sub-portions by dividing the circuit cells into colorable sub-portions, wherein each circuit cell is associated with one or more colorable sub-portions, and wherein multi-row circuit cells include a plurality of colorable sub-portions;
   identifying a colorable sub-portion that violates a circuit design rule as a violating colorable sub-portion;
   determining that the violating colorable sub-portion is to be re-colored;
   creating a separate color swap layer, and indicating, via at least one shape of the color swap layer that the violating colorable sub-portion, but not the rest of the circuit cell, is to be at least partially re-colored, wherein re-coloring the sub-portion includes changing the color(s) of the colorable sub-portion without switching to another circuit cell; and
   physically generating a lithographic mask based at least the re-colored sub-portion.

2. The method of claim 1, wherein dividing includes dividing multi-row circuit cells into colorable sub-portions based, at least in part, upon row height.

3. The method of claim 2, wherein determining includes iterating through colorable sub-portions by row, and
   wherein if a multi-row circuit cell is encountered in a current row, iterating through all colorable sub-portions of the multi-row circuit cell within the current row and other colorable sub-portions of other circuit cells within the current row, before iterating through a colorable sub-portion of the multi-row circuit cell within a next row.

4. The method of claim 1, wherein indicating includes altering a color swap layer shape that indicates to a mask generator that at least a layout portion of the circuit cell is to be re-associated from a first lithographic mask to a second lithographic mask.

5. The method of claim 4, wherein at least one colorable sub-portion of the circuit cell is associated with a respective portion of the color swap layer.

6. The method of claim 1, wherein a circuit cell includes a first colorable sub-portion and a second colorable sub-portion;
   wherein determining includes determining that the first colorable sub-portion is to be re-colored and that the second colorable sub-portion is not to be re-colored; and
   wherein indicating includes associating the first colorable sub-portion with a shape of a color swap layer, and not associating the second colorable sub-portion with any shape of the color swap layer.

7. The method of claim 1, wherein indicating that the violating colorable sub-portion is to be at least partially re-colored occurs after a determination has been made for all circuit cells whether each of the circuit colorable sub-portions are to be re-colored.

8. The method of claim 1, wherein indicating includes replacing a circuit cell associated with the violating colorable sub-portion with an at least partially re-colored version of the circuit cell.

9. The method of claim 1, wherein dividing circuit cells into colorable sub-portions includes dividing the circuit cells into colorable sub-portions having variable widths and uniform heights.

10. A method comprising:
    receiving a circuit layout database that includes instantiations of circuit cells, wherein each instantiation includes one or more layout portions, wherein each layout portion is associated with a respective lithographic mask;
    creating sub-portions of each instantiation of circuit cells by dividing the respective instantiations of the circuit cells into sub-portions of uniform height, wherein each instantiation includes one or more sub-portions;
    evaluating if a design rule violation occurs between a first sub-portion and a second sub-portion;
    determining if the design rule violation is to be corrected by re-associating one or more of the layout portions of the second sub-portion with a new lithographic mask;
    if so, re-associating one or more of the layout portions of the second sub-portion with the new lithographic mask, wherein re-associating includes creating a color swap layer that identifies that the second sub-portion, and using at least in part the color swap layer, changing only the lithographic mask associated with the second sub-portion and not replacing the respective instantiation of the circuit cell with a new instantiation of the circuit cell; and
    physically creating the new lithographic mask.

11. The method of claim 10, wherein re-associating one or more of the layout portions of the second sub-portion with the new lithographic mask includes associating the layout portions with a color swap layer shape, wherein the color swap layer shape causes a mask generator to re-associate layout portions covered by the color swap layer shape with new lithographic masks.

12. The method of claim 10, wherein organizing includes:
    dividing a multi-row instantiation of a circuit cell into multiple sub-portions; and
    organizing a single-row instantiation of a circuit cell into a single sub-portion.

13. The method of claim 10, wherein evaluating includes iterating through sub-portions by row, and
    wherein if a multi-row instantiation of a circuit cell is encountered in a current row, iterating through all sub-portions of the multi-row instantiation of the circuit cell within the current row and other sub-portions of other instantiations of other circuit cells within the current row, before iterating through a sub-portion of the multi-row instantiation of the circuit cell within a next row.

14. The method of claim 10, wherein an instantiation of circuit cell includes a first sub-portion and a second sub-portion; and
    wherein re-associating includes re-associating the first sub-portion with a new lithographic mask but maintaining an association between the second sub-portion with an original lithographic mask.

15. The method of claim 10, wherein receiving includes:
    placing a new instantiation of a circuit cell;

performing the organizing, evaluating, determining, and if determined, the re-associating steps of claim 10 for the new instantiation of a circuit cell; and repeating the placing, organizing, evaluating, determining, and if determined, the re-associating steps for each desired instantiations of respective circuit cells until a circuit layout is complete.

16. The method of claim 10, wherein re-associating includes replacing an instantiation of a first circuit cell associated with the second sub-portion with an instantiation of a second circuit cell, wherein the second circuit cell is functionally equivalent to the first circuit cell but is includes different associations with one or more lithographic masks.

17. The method of claim 10, wherein evaluating includes measuring a distance between two layout portions that are associated with a common lithographic mask, and evaluating if the distance is greater than a threshold value.

18. A system comprising:

a place and route tool configured to place instantiations of template circuit cells in a ordered pattern in a database of circuit layout;

a color checker tool configured to:

organize the instantiations by creating sub-portions from parts of respective instantiations of the template circuit cells, wherein each instantiation is associated with one or more sub-portions, determine if color conflicts occur between neighboring sub-portions, and create a separate color swap layer, and employ the color swap layer to indicate that a violating sub-portion, but not an entirety of an instantiation of the template circuit cells that is associated with the violating sub-portion, is to be re-colored, in whole or part, to correct a detected color conflict; and a mask generator configured to:

physically generate at least two lithographic masks based upon a re-colored version of the circuit layout.

19. The system of claim 18, wherein the color checker is configured to draw a shape, in a color swap layer, around at least a part of the violating sub-portion; and wherein the mask generator is configured to dynamically re-associate one or more components enclosed by the shape in the color swap layer with an alternate lithographic mask.

20. The system of claim 18, wherein the color checker is configured to replace, within the database of circuit layout, a violating instantiation that includes the violating sub-portion with an alternate instantiation that is functionally equivalent to the violating instantiation, but includes different associations with one or more lithographic masks.

* * * * *